(12) United States Patent
Schillinger et al.

(10) Patent No.: US 12,025,475 B2
(45) Date of Patent: Jul. 2, 2024

(54) STEERING DEVICE SENSOR, MEASUREMENT SYSTEM, OPERATOR CONTROL SYSTEM, AND STEERING DEVICE

(71) Applicant: ZF AUTOMOTIVE SAFETY GERMANY GMBH, Aschaffenburg (DE)

(72) Inventors: Michael Schillinger, Aschaffenburg (DE); Guido Hirzmann, Sailauf (DE)

(73) Assignee: ZF AUTOMOTIVE SAFETY GERMANY GMBH, Aschaffenburg (DE)

(*) Notice: Subject to any disclaimer, the term of this patent is extended or adjusted under 35 U.S.C. 154(b) by 168 days.

(21) Appl. No.: 17/628,880

(22) PCT Filed: Jul. 22, 2020

(86) PCT No.: PCT/EP2020/070627
§ 371 (c)(1),
(2) Date: Jan. 20, 2022

(87) PCT Pub. No.: WO2021/013870
PCT Pub. Date: Jan. 28, 2021

(65) Prior Publication Data
US 2022/0252432 A1 Aug. 11, 2022

(30) Foreign Application Priority Data
Jul. 23, 2019 (DE) ............ 10 2019 119 860.7

(51) Int. Cl.
*G01D 5/24* (2006.01)
*B62D 1/06* (2006.01)
*G05G 9/047* (2006.01)

(52) U.S. Cl.
CPC ............... *G01D 5/24* (2013.01); *B62D 1/06* (2013.01); *G05G 9/047* (2013.01); *G05G 2009/04774* (2013.01)

(58) Field of Classification Search
CPC ... G01D 5/24; B62D 1/04; B62D 1/06; B62D 1/065; B62D 15/0205; G05G 9/047;
(Continued)

(56) References Cited

U.S. PATENT DOCUMENTS 8,841,929 B2 * 9/2014 Bennett ............... B62D 1/046
324/705
9,641,172 B2 * 5/2017 Salter .................. H03K 17/962
(Continued)

FOREIGN PATENT DOCUMENTS

CN 112074707 A * 12/2020 ....... B60R 21/01532
DE 102017205640 B3 7/2018
(Continued)

OTHER PUBLICATIONS

PCT International Search Report for corresponding International Application Serial No. PCT/EP2020/070627, mailed Oct. 22, 2020, pp. 1-6.
(Continued)

*Primary Examiner* — Giovanni Astacio-Oquendo
(74) *Attorney, Agent, or Firm* — TAROLLI, SUNDHEIM, COVELL & TUMMINO L.L.P.

(57) ABSTRACT

The invention relates to a steering device sensor comprising an electrically insulating support, which can be integrated in a steering device for a vehicle, and an electric conductor, which is connected to the support, characterised in that the conductor forms multiple measurement zones of different measuring sensitivity on the support. The invention also relates to a measurement system comprising two steering device sensors. The invention also relates to an operator
(Continued)

control system using a measurement system comprising two steering device sensors. The measurement system and the operator control system can be used in a steering device such as a steering wheel.

20 Claims, 4 Drawing Sheets

(58) Field of Classification Search
CPC .......... G05G 2009/04774; G06F 3/044; G06F 3/0443; G06F 3/0446; G01R 27/2605
USPC .................. 324/519, 658, 663, 686
See application file for complete search history.

(56) References Cited

U.S. PATENT DOCUMENTS

| | | | | |
|---|---|---|---|---|
| 9,827,996 | B2* | 11/2017 | McMillen | B62D 1/046 |
| 10,528,201 | B2* | 1/2020 | Leigh | A63F 13/214 |
| 10,572,088 | B2* | 2/2020 | Alack, Jr. | G06F 3/04166 |
| 10,635,225 | B2* | 4/2020 | Seok | G06F 3/0488 |
| 10,654,486 | B2* | 5/2020 | McMillen | B60W 50/0098 |
| 10,822,014 | B2* | 11/2020 | Boittiaux | G01D 5/16 |
| 10,843,720 | B2* | 11/2020 | Kwon | B62D 1/046 |
| 10,895,656 | B2* | 1/2021 | Okazaki | G01V 3/08 |
| 10,969,875 | B2* | 4/2021 | Leigh | A63F 13/214 |
| 11,068,068 | B2* | 7/2021 | Leigh | G06F 3/0445 |
| 11,112,905 | B2* | 9/2021 | Alack, Jr. | G06F 1/163 |
| 11,136,057 | B2* | 10/2021 | Boittiaux | B60R 21/01552 |
| 11,142,233 | B2* | 10/2021 | Seok | B62D 1/046 |
| 11,242,069 | B2* | 2/2022 | Okazaki | G01V 3/08 |
| 11,654,951 | B2* | 5/2023 | Boittiaux | B62D 1/10 324/699 |
| 11,654,953 | B2* | 5/2023 | Odate | B62D 1/08 74/552 |
| 2006/0016800 | A1* | 1/2006 | Paradiso | H05B 3/746 219/497 |
| 2013/0234425 | A1* | 9/2013 | Skowronek | B62D 1/16 280/93.502 |
| 2016/0142052 | A1* | 5/2016 | Liu | H03K 17/962 200/600 |
| 2016/0375910 | A1* | 12/2016 | McMillen | B62D 1/046 701/36 |
| 2018/0015932 | A1* | 1/2018 | McMillen | B60W 40/09 |
| 2018/0129320 | A1* | 5/2018 | Moseley | G06F 3/0448 |
| 2018/0164921 | A1* | 6/2018 | Leigh | G06F 3/0448 |
| 2018/0251146 | A1* | 9/2018 | Boittiaux | B62D 1/10 |
| 2018/0348392 | A1* | 12/2018 | Nishio | B62D 1/046 |
| 2018/0354543 | A1* | 12/2018 | Nishio | B62D 1/065 |
| 2018/0364840 | A1* | 12/2018 | Alack, Jr. | G06F 1/163 |
| 2019/0025824 | A1* | 1/2019 | Odate | B62D 1/046 |
| 2019/0025974 | A1* | 1/2019 | Seok | G06F 3/0488 |
| 2019/0210629 | A1* | 7/2019 | Kwon | G06F 3/0448 |
| 2019/0210630 | A1* | 7/2019 | Seok | G06F 3/0448 |
| 2019/0389489 | A1* | 12/2019 | Okazaki | G01B 7/00 |
| 2020/0041680 | A1* | 2/2020 | Okazaki | G01V 3/088 |
| 2020/0142516 | A1* | 5/2020 | Leigh | G06F 3/04164 |
| 2020/0142517 | A1* | 5/2020 | Leigh | A63F 13/803 |
| 2020/0158540 | A1* | 5/2020 | Kunieda | B62D 1/04 |
| 2020/0192505 | A1* | 6/2020 | Alack, Jr. | A63F 13/2145 |
| 2020/0255047 | A1* | 8/2020 | Boittiaux | G01D 5/16 |
| 2021/0394811 | A1* | 12/2021 | Boittiaux | B62D 1/10 |
| 2022/0252432 | A1* | 8/2022 | Schillinger | B62D 1/06 |
| 2022/0340190 | A1* | 10/2022 | Schneider | B62D 1/065 |

FOREIGN PATENT DOCUMENTS

| | | | | | |
|---|---|---|---|---|---|
| DE | 102017129316 | A1 | * | 1/2019 | .......... B60R 16/005 |
| DE | 102018219235 | A1 | * | 7/2019 | .......... B60R 16/027 |
| DE | 112017005459 | T5 | * | 7/2019 | .......... B60R 16/027 |
| DE | 112017005459 | T5 | | 7/2019 | |
| DE | 112018001935 | T5 | * | 12/2019 | ............ B32B 15/14 |
| DE | 112018005213 | T5 | * | 6/2020 | .......... B60R 16/037 |
| DE | 102019119860 | A1 | * | 1/2021 | ............ B62D 1/046 |
| DE | 102021110299 | A1 | * | 10/2022 | ............ B62D 1/046 |
| JP | 2017037756 | A | * | 2/2017 | |
| JP | 2017069170 | A | * | 4/2017 | |
| JP | 2017188457 | A | * | 10/2017 | |
| JP | 2017188458 | A | * | 10/2017 | |
| JP | 2018203061 | A | * | 12/2018 | ............ B62D 1/046 |
| WO | WO-2015119285 | A1 | * | 8/2015 | ............ B62D 1/046 |
| WO | 2016/087231 | A1 | | 6/2016 | |
| WO | WO-2016087231 | A1 | * | 6/2016 | ............. B62D 1/04 |
| WO | WO-2016210173 | A1 | * | 12/2016 | ............ B60W 40/09 |
| WO | 2018/078553 | A1 | | 5/2018 | |
| WO | WO-2018078553 | A1 | * | 5/2018 | ............ B62D 1/046 |
| WO | WO-2018168374 | A1 | * | 9/2018 | ............... B62D 1/06 |
| WO | WO-2018168376 | A1 | * | 9/2018 | ............ B60W 50/14 |
| WO | WO-2021013870 | A1 | * | 1/2021 | ............ B62D 1/046 |
| WO | WO-2022255412 | A1 | * | 12/2022 | |

OTHER PUBLICATIONS

German Search Report for corresponding German Application Serial No. 10 2019 119 860.7, dated Apr. 3, 2020, pp. 1-10.

* cited by examiner

STEERING DEVICE SENSOR, MEASUREMENT SYSTEM, OPERATOR CONTROL SYSTEM, AND STEERING DEVICE

RELATED APPLICATIONS

This application is a U.S. National Stage Application filed under 35 USC 371, claiming priority to Serial No. PCT/EP2020/070627, filed on 22 Jul. 2020; which claims priority from German Patent Application DE 10 2019 119 860.7, filed 23 Jul. 2019, the entireties of which are hereby incorporated herein by reference.

TECHNICAL FIELD

The invention relates to a steering device sensor, such as a steering wheel sensor for hand recognition, in particular a capacitive steering device sensor, a measurement system, such as a capacitive measurement system, an operator control system, such as a capacitive operator control system, and a steering device, such as a steering wheel or a joystick.

BACKGROUND

From DE 10 2017 205 640 B3 a steering wheel is known for detecting a control gesture. The steering wheel comprises three electrodes, each forming a sensory region. Changes measured in a particular sensory region are assigned to specific control gestures for the sensory region. The changes are measured as a changing voltage of a respective electrode, which is caused by a change in an electric field of the electrode by the control gesture. The well-known steering unit does not detect control gestures with sufficient accuracy and robustness.

From WO 2018/078553 A1, a steering wheel is known, which has a number of sensors which can be used to detect control gestures. The number of sensors and the need to connect them electrically to an evaluation unit is difficult in the limited installation space of a steering unit, such as a steering wheel. In addition, the costs for the evaluation unit increase with the number of sensor signals to be evaluated.

SUMMARY

It is an object of the invention to overcome the disadvantages of the prior art, in particular to provide a sensor element, a measurement system operator control system and a steering device, wherein the reliable detection of control gestures, a small installation space requirement and cost-effective feasibility are possible. This object is achieved by the combination of features of the independent claims.

According to a first aspect of the invention, a steering device sensor includes an electrically insulating support which can be integrated into a steering device for a vehicle and an electrical conductor connected to the support.

According to the invention, the conductor on the support forms multiple measuring zones of different measuring sensitivity. The measuring zones of different measuring sensitivity cause different output signals depending on the measuring zone on which the action occurs, with essentially the same effect on the steering device sensor which causes a measurement signal. In particular, when designed as a capacitive steering device sensor for approach or touch sensing, the same influence on the measuring zones can be assumed, taking into account a tolerance range, if the measuring zones are touched with fingers or parts of a hand.

The measuring zones are part of a single electrical conductor which requires only one supply and measurement circuit, such as a power supply, when using conventional capacitive measuring methods. The electrical conductor is in one piece, with the measuring zones forming sections of the conductor. The conductor can be formed as a layer of conductive material, a wire or a filament.

An electrically insulating support which can be integrated into a steering device means a support which is suitable for the construction of a sensor in a steering device with regard to its electrical and mechanical properties. Steering devices for vehicles are grasped by at least one hand of a person driving the vehicle. For ergonomic reasons, steering devices, such as joysticks or steering wheels, usually have a rod or ring-shaped basic shape, the rod or ring direction of extent of which forms an axle to be grasped by a controlling hand. The diameter of a steering device to be grasped by the hand is 10 centimeters or less, in particular 5 centimeters or less. Mechanically, the support material around the axis of the rod or ring extension must be flexible enough to adapt to the section of the steering device to be grasped. In particular, the support material around at least a second axis, which is perpendicular to the direction of extent of the rod or ring, must be flexible enough to adapt to the basic shape, such as a ring shape or a lobe shape, of the steering device. The above applies equally to the material of the electrical conductor, which must also be suitable for being attached to or integrated into the support material. A mechanical connection between the support and the electrical conductor can be achieved by gluing, printing, vapor deposition, sewing, embroidery, knitting, hot forming or a combination of a plurality of the aforementioned possibilities.

In a preferred design, the measuring sensitivities of the multiple measuring zones increase strictly monotonically in a main direction of the extent of the steering device sensor. The main direction of the extent is functionally defined in the direction of the sequence of the measuring zones of different measuring sensitivity. An extent of the measuring zones in a direction transverse to the main direction of the extent can essentially be designed freely according to application requirements, wherein there may be requirements for a minimum amount of electric conductor in a measuring zone, depending on which measuring regions and sensitivities are to be achieved. Due to the monotonically increasing arrangement, a monotonically increasing measurement signal results when measuring with the steering device sensor, the level of which provides an indication of the measuring zone that mainly influences the measurement and thus of the location of the measurement along the main direction of the extent of the steering device sensor.

In a preferred design, the measuring sensitivities of the multiple measuring zones increase linearly in a main direction of the extent of the steering device sensor. With a linear rise, a uniform spatial resolution is achieved along the main direction of extent. In an alternative version, measuring sensitivities of the multiple measuring zones increase exponentially in a main direction of the extent of the steering device sensor. In this variant, the measurement dynamics and/or the spatial resolution can vary along the main direction of the extent of the steering device sensor.

In a preferred design, the conductor comprises a base extending along a main direction of extent, wherein the multiple measuring zones extend transversely away from the base.

In a preferred design, the electrical conductor forms a base which electrically conductively connects the multiple measuring zones, wherein the base has a lower measuring sensitivity than a measuring zone of the lowest measuring sensitivity of the multiple measuring zones. Preferably, the measuring sensitivity of the base is in a negligible range relative to the measuring sensitivity of the measuring zones and a capacitive touch measurement. In particular, the measuring sensitivity of the base is so much lower than that of the measuring zones that a contact with the base is distinguishable from a contact with one of the measuring zones.

In a preferred embodiment, a distance is formed between two of the multiple measuring zones, wherein the distances between the multiple measuring zones decrease strictly monotonically in a main direction of the extent of the steering device sensor.

In a preferred embodiment, the support comprises a film and the electrical conductor comprises an electrically conductive material printed on the film.

In a preferred embodiment, the support comprises woven goods, knitted fabrics and/or knitted goods and the electrical conductor comprises an electrically conductive thread. In particular, the support is entirely formed as a fabric, a knitted fabric or knitted goods. In particular, the support may be a combination of fabric, knitted and/or crocheted fabric. In particular, the electrical conductor is glued, soldered, sewn, knitted or nailed to the support, or the support is embroidered with the electrical conductor. In particular, a combination of the aforementioned fastenings may be provided to connect the electrical conductor to the support.

In a preferred embodiment, the support comprises a thermoplastically deformable plastic, wherein the electrical conductor is at least partially enclosed by the plastic in the circumferential direction of the conductor. In particular, the thermoplastically deformable plastic is a foam. Preferably, the electrical conductor is connected to the support by heating it and inserting it into the thermoplastically deformable plastic. In particular, more than 25 percent, more than 33 percent or more than 40 percent of the electrical conductor is bordered or enclosed by the support in the circumferential direction of the conductor. In particular, less than 70 percent, less than 60 percent, or less than 51 percent of the electrical conductor is bordered or enclosed by the support in the circumferential direction of the conductor.

In a preferred embodiment, the measuring zones are each formed by a surface electrode covered by the electrical conductor.

In a preferred embodiment, the steering device sensor comprises measuring zones, each of which is traversed by the electrical conductor, in particular meander-wise. In particular, the electrical conductor passes through the measuring zone in such a way that at each point of the measuring zone a distance from the electrical conductor is smaller than a maximum conductor distance. In particular, the maximum conductor distance is 10 millimeters or less, in particular 5 millimeters or less, preferably 2 millimeters or less. The measuring zones can be defined in particular as those areas of the steering device sensor that are less than the maximum conductor distance from the electrical conductor and are not part of the base of the steering device sensor. The maximum conductor distance refers to a distance in the plane of the surface extent of the steering device sensor.

In a preferred embodiment, the steering device sensor comprises an electrical auxiliary function conductor which is arranged below the electrical conductor relative to an upward-pointing direction from the support to the electrical conductor. In other words, the electrical conductor is the one above the support and the electrical auxiliary function conductor is either below the support or between the electrical conductor and the support, wherein the electrical auxiliary function conductor is electrically insulated from the electrical conductor. The electrical auxiliary function conductor may also comprise a semiconductor or consist of a semiconductor. In particular, the electrical auxiliary function conductor is used as a shield. In its structural design, the auxiliary function conductor resembles the electrical conductor. In particular, the auxiliary function conductor as a shield is connected or controlled as shielding at ground potential, as active shielding or as dynamic shielding. In particular, the auxiliary function conductor is connected in such a way that it temporarily works as a sensor like the electrical conductor. In this embodiment, an electric field can be formed between the auxiliary function conductor working as a sensor and the electrical conductor, the preferably capacitive influence of which can be measured by capacitive coupling. As a shield, the electrical auxiliary function conductor has the effect of improving the quality of a measurement signal from the electrical conductor and suppressing interference such as interference fields.

The invention also relates to a measurement system for a steering device comprising two steering device sensors, each with multiple measuring zones of different sensitivity, in particular as described above. According to the invention, the measuring zones of the steering device sensors are arranged in such a way that, in pairs, a measuring zone of one steering device sensor with a respective adjacent measuring zone of the other steering device sensor have a distinct combination of measuring sensitivities.

In particular, a measuring zone of one steering device sensor is arranged in each case next to a measuring zone of different measuring sensitivity of the other steering device sensor. Preferably, the measuring zones are dimensioned in such a way that steering device sensors of at least one measuring zone always output a measurement signal during a measuring process. In this context, a distinct combination means that a certain combination of measuring sensitivities occurs only once within the measurement system. Depending on which section of the measurement system is measured, there is a distinct output level, or a distinct combination of output levels, related to the same cause of the measurement signal. With the help of the measuring sensitivities, a spatial resolution of the measurement along the multiple measuring zones is possible.

In a preferred embodiment, the steering device sensors are each comb-like and are arranged interlocked or nested with each other.

In a preferred embodiment, the measurement system is set up and intended to determine a difference signal of the steering device sensors. In particular, the measurement system comprises or can be connected to evaluation electronics which preferably subtract the measurement signals of the steering device sensors from each other.

In a preferred embodiment, the steering device sensors each comprise an electrical conductor connected to a common support.

In a preferred embodiment, the measurement system comprises an auxiliary function conductor, which can be controlled in particular as a sensor or a shield as described above. Preferably, the auxiliary function conductor is arranged below the measuring zones relative to an upward-pointing direction from the support via the measuring zones to the object to be measured. The auxiliary function conductor may also be mounted on a separate support or be a separate fabric, crocheted fabric, braid or an electrically conductive steering device structure.

The invention also relates to an operator control system for a steering device comprising a measurement system designed in particular as described above for detecting a contact with the steering device, wherein the measurement system has multiple pairs of measuring zones with a distinct combination of measuring sensitivities, and an evaluation device, wherein the evaluation device is set up and intended to receive a difference signal concerning the multiple pairs of measuring zones of different measuring sensitivity and to determine the pair of measuring zones which was contacted from the difference signal curve. Measuring zones of one steering device sensor have a distinct combination of measuring sensitivities with a respective measuring zone of the adjacently arranged other steering device sensor. In particular, the steering device sensors are designed as a comb-like structure. In particular, the steering device sensors have a base extending in a direction of extent comparable to the shaft of a comb. In particular, the measuring zones extend transversely from the base, like the teeth of the comb.

Finally, the invention also relates to a steering device for a motor vehicle comprising at least one steering device sensor as described above for detecting a contact with the steering device. According to the invention, the steering device sensor has multiple measuring zones of different measuring sensitivity. In particular, the steering device is a joystick. Preferably, the steering device is a steering wheel for a motor vehicle, such as a passenger car or a truck. Preferably, a measurement system with two steering device sensors is integrated into a section of the steering device to be grasped by a hand. In particular, the support to which the steering device sensors are connected is wrapped or foamed around a steering wheel skeleton or a joystick structure. In particular, a shield is arranged between the support and the steering wheel skeleton or the joystick structure.

BRIEF DESCRIPTION OF THE DRAWINGS

Further features, advantages and properties of the invention are explained by the description of preferred embodiments of the invention with reference to the figures. In the figures.

DESCRIPTION

Figure 1:
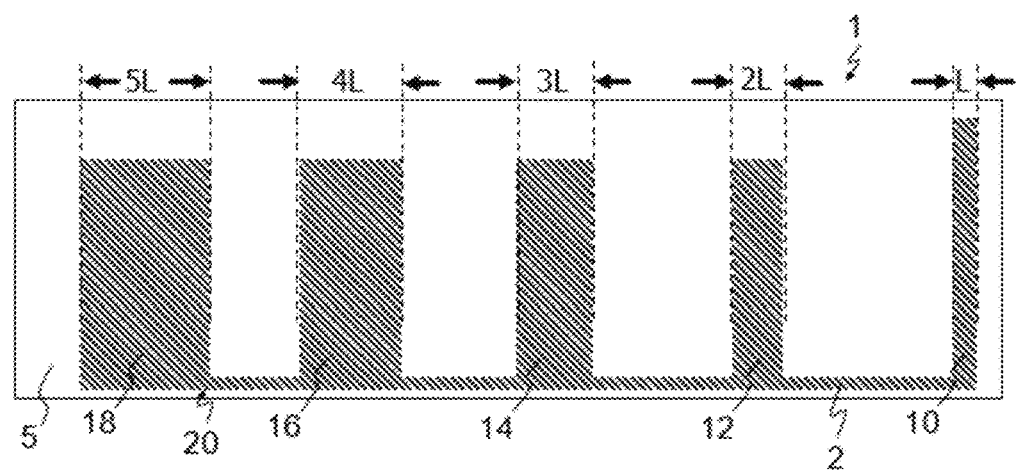
FIG. 1: shows a schematic representation of a steering device sensor according to the invention in a first embodiment.

FIG. 1 shows a steering device sensor 1 according to the invention according to a first exemplary embodiment. The steering device sensor 1 is formed on a support 5. The support 5 in this example is a flexible film, made of an electrically insulating material. The steering device sensor 1 also includes an electrical conductor 2, which is formed as a surface structure on the support 5. The electrical conductor 2 can be printed on the flexible film or vapor deposited with a deposition method. The surface structure of the electrical conductor 2 forms multiple measuring zones 10, 12, 14, 16, 18. The measuring zones are electrically connected via a common base 20 of the electrical conductor 2 extending along the measuring zones. The base itself is desirably dimensioned with regard to the design of the electrical conductor 2 in such a way that it has a measuring sensitivity that is negligible compared to the measuring sensitivity of the measuring zones. The measuring zones 10, 12, 14, 16, 18 have a different width and consequently a different area. The width of the measuring zone 10 is a unit of length L, that of the measuring zone 12 two units of length L and so on up to the measuring zone 18, the width of which is five lengths L. The width and area of the measuring zones increase linearly with the width.

The steering device sensor 1 is designed as a capacitive proximity sensor, which works according to the principle of capacitive coupling, wherein connections and evaluation electronics are not shown in more detail. For example, a capacitance is measured by connecting a charging voltage and measuring the charging time at the steering device sensor 1. This is essentially determined by the capacitance of the respective measuring zone 10, 12, 14, 16, 18, the electric field of which is capacitively coupled to a ground potential by a finger placed on the measuring zone, for example. The different surface contents of the measuring zones result in different starting signals, depending on which measuring zone is influenced. If a hand or finger touches measuring zone 10, this results in a capacitive coupling with a smaller capacitance than with measuring zone 12, whose area and capacitance are larger. Different measuring sensitivities of the measuring zones 10, 12, 14, 16, 18, will be mentioned here, because with the same causative input, here the touch by a finger, a different capacitance can be measured, depending on which measuring zone is touched. In this example, the measuring sensitivities of the measuring zones increase linearly from measuring zone 10 to measuring zone 18, corresponding to the linear increase in the area of the measuring zones. In another, unspecified embodiment, the measuring sensitivities of the measuring zones increase exponentially, for example by squares or cubes. For this purpose, the length measure L of measuring zones shown in the example of FIG. 1 can increase exponentially from measuring zone to measuring zone, such as by cubes or squares.

For the detection of a contact and the exact determination of the capacitive coupling, i.e. the size of the coupled capacitance, a known measuring method can be used, such as the capacitive voltage divider method. The different measuring sensitivities make it possible to determine the position at which the steering device sensor 1 was touched. In this embodiment, it is assumed that the effect on the steering device sensor, i.e. the input signal, essentially corresponds to a standardized quantity, which applies to an approach or a touch by human fingers, taking into account a tolerance range.

Figure 2:
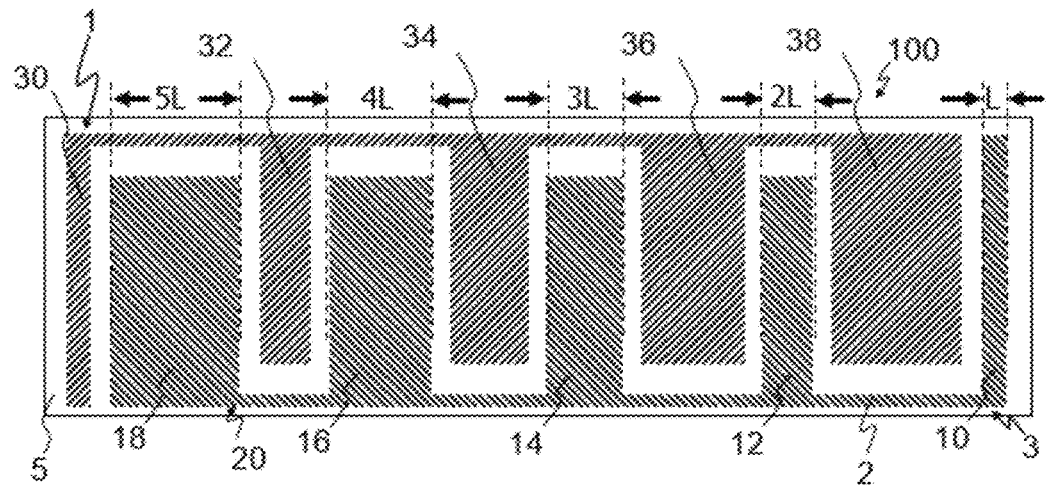
FIG. 2: shows a schematic representation of a measurement system according to the invention with two steering device sensors according to the invention in a first embodiment.

FIG. 2 shows a measurement system 100 according to the invention according to a first embodiment comprising a first steering device sensor 1 and a second steering device sensor 3. Not shown in detail in the figure are the electrical connections and evaluation electronics by means of which the measurement system 100 generates, detects and processes the signals of the steering device sensors 1, 3. The measurement system 100 is designed as a capacitive measurement system which works according to the principle of capacitive coupling. Such a device of the steering device sensors 1, 3 as a capacitive measurement system for detecting a touch is known, which is why it is not discussed further.

The steering device sensors 1, 3 are each designed like the steering device sensor according to FIG. 1, wherein the electrical conductors 2, 2' of the steering device sensors 1, 3 are applied to a common support 5. The measuring zones 10, 12, 14, 16, 18 of the steering device sensor 3 are arranged on the support 5 in such a way that a distance is formed between two measuring zones within which a measuring zone 30, 32, 34, 36 of the steering device sensor 1 is arranged. Conversely, the measuring zones 30, 32, 34, 36, 38 of the steering device sensor 1 are arranged on the support 105 in such a way that a distance is formed between two measuring zones within which a measuring zone 10, 12, 14, 16, 18 of the steering device sensor 3 is arranged. The distances between the measuring zones thus become smaller in accordance with the aforementioned increase in the area of the measuring zones of the other steering device sensor.

The comb-like structure of the two steering device sensors allows the nesting of the measuring zones. The dimensioning of the measuring zones is designed in such a way that, starting from the touching object to be detected, for example a finger or a palm of the hand, it is ensured that a touch always touches two, i.e. one of the measuring zones of each the two steering device sensors 1.3. A respective measuring zone of one steering device sensor forms a pair of measuring zones with a respective measuring zone of the other adjacent steering device sensor on the support 5. A respective combination of measuring sensitivities of a pair of measuring zones, for example the measuring zones 10, 38 or the measuring zones 12, 36 or the measuring zones 38,12, is unique along the main extent of the measurement system 100, i.e. along the sequence of measuring zones. Thus, if the measurement system 100 is touched in the area of the pair of measuring zones 10, 38, a low capacitance can be measured on the steering device sensor 3 and at the same time a high capacitance on sensor 1. In the example shown in FIG. 2, the measuring zone 10 would have the lowest capacitance and the measuring zone 38 the highest capacity compared to the other measuring zones of a respective steering device sensor. With the help of the distinct combinations of measuring sensitivities of respective two adjacent measuring zones and always contact of two measuring zones, it is possible to determine the position of the measurement system 100 along the main direction of the extent of the support 5 which was touched.

Figure 3:
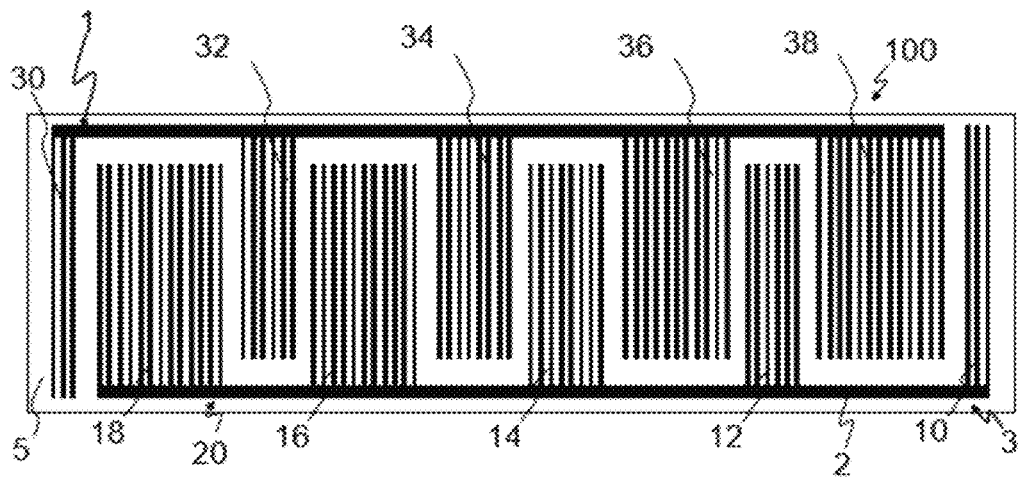
FIG. 3: shows a schematic representation of a measurement system according to the invention with two steering device sensors according to the invention in a further embodiment.

FIG. 3 shows a further exemplary embodiment of a measurement system according to the invention which is essentially identical to the measurement system 100 of FIG. 2. Identical components are provided with the same reference numbers. The measurement system 100 according to FIG. 3 differs from the measurement system 100 according to FIG. 2 only in that the steering device sensors 3, 5 are designed differently. While according to FIG. 2 the measuring zones 10, 12, 14, 16, 18, 30, 32, 34, 36, 38 are designed as continuous surfaces of conductor material, the measuring zones in the example of FIG. 3 are realized by multiple conducting material tracks spaced apart from each other. It is decisive for the invention here that the measuring sensitivities of the measuring zones differ from each other due to the different surfaces covered by conductor material or the amount of interconnected conductor material present in the measuring zone.

Figure 4:
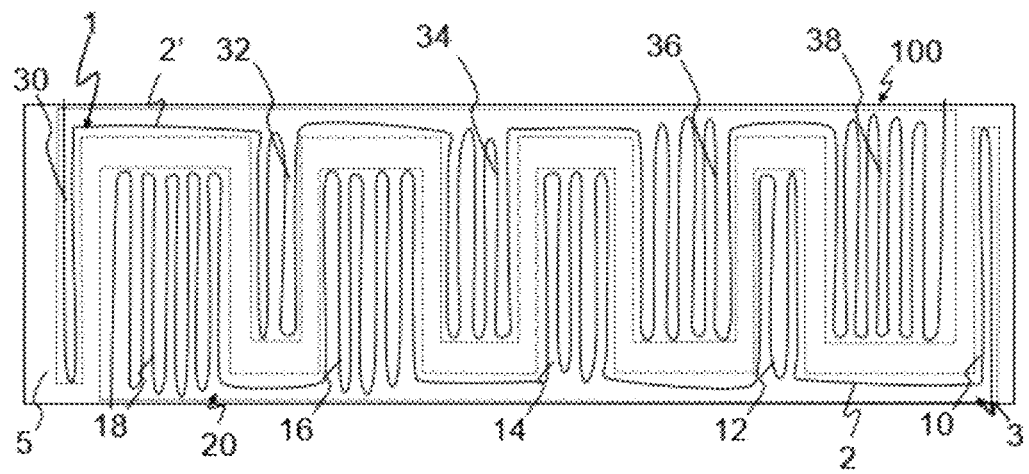
FIG. 4: shows a schematic representation of a measurement system according to the invention with two steering device sensors according to the invention in a further embodiment.

FIG. 4 shows a further exemplary embodiment of a measurement system according to the invention, which is essentially identical to the measurement system of FIG. 2 or FIG. 3. Identical components are provided with the same reference numbers. The measurement system 100 according to FIG. 4 differs from the measurement systems according to FIGS. 2 and 3 only in that the steering device sensors 3, 1 are designed differently. The electrical conductors 2, 2' of the steering device sensors 3, 1 are designed as electrically conductive wire or thread connected to the support 5. The electrical conductors 2, 2' run in meandering loops through the measuring zones 10, 12, 14, 16, 18 or the measuring zones 30, 32, 34, 36, 38, wherein the length of the electrical conductor arranged within a respective measuring zone 2, 2', i.e. the thread length or wire length, according to the basic principle of the invention increases from measuring zone to measuring zone of the respective steering device sensor 3, 1 in order to realize different measuring sensitivities.

Figure 5:
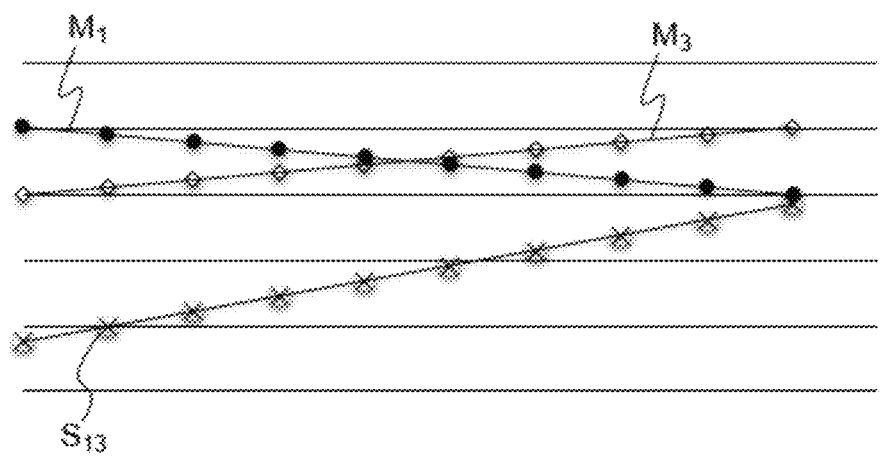
FIG. 5: shows a diagram showing qualitatively the output signals of three steering device sensors.

FIG. 5 represents qualitatively in a diagram measuring sensitivity and signal level on the vertical axis and along the planar axis the measuring zones arranged consecutively in the main direction of the extent of a measurement system according to the invention 100. The profile M1 of the measuring sensitivities in a steering device sensor is shown with black full dots, the measuring sensitivities of which decrease linearly from a first measuring zone at one end of the steering device sensor to the last measuring zone at the other extent of the steering device sensor. Diamonds are used to show the profile M3 of the measuring sensitivities of the other steering device sensor of the measurement system 100, the measuring sensitivities of which increase from one measuring zone at one end of the measurement system 100 to the other end of the measurement system 100. S13 shows the profile of the level of a difference signal of the measurement signals of the steering device sensors of the measurement system 100. The level increases continuously with essentially the same effect on the measurement system 100 in the respective touched measuring zones along the extent of the measurement system. Using the rising level, it is thus possible to determine the location of the contact on the measurement system 100. Predetermined level ranges can be determined in a calibration process in order to assign certain levels to measuring zones which are touched.

Figure 6:
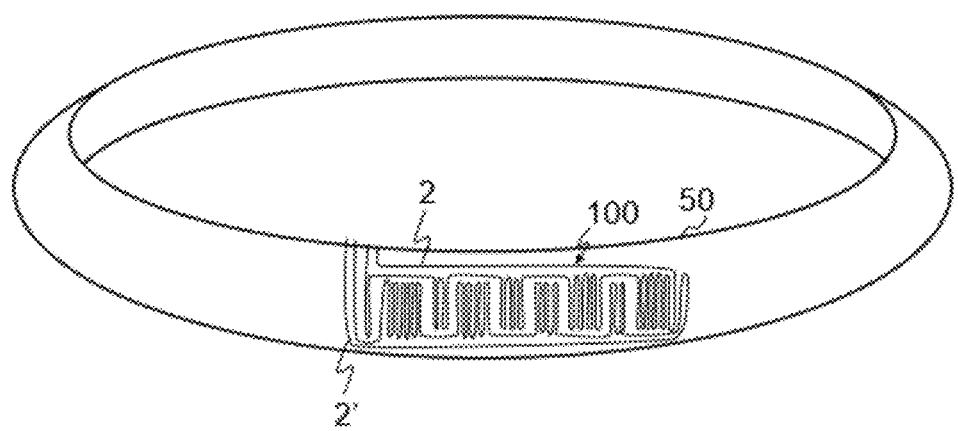
FIG. 6: shows a schematic representation of a steering device according to the invention in a first embodiment.

In FIG. 6, an example of a steering device according to the invention in the form of a steering wheel 50 is shown, in the steering wheel rim of which a measurement system 100 is integrated. For the sake of a simplified representation, the measurement system 100 is only displayed along a part of the steering wheel ring. The measurement system 100 can extend around the entire steering wheel ring and also around the circumference in the gripping direction. The measurements in the representation are not true to scale. The measuring zones are dimensioned in such a way that a suitable spatial resolution is achieved for the desired contacts to be measured. The measurement system 100 is arranged underneath a top layer, such as a leather layer. The measurement system 100 in the example is according to the example of FIG. 4, with the difference that the support 5 is an unspecified foam that envelops a steering wheel skeleton, and the electrical conductors 2,2' are designed as electrically conductive wires integrated into a steering wheel foam. In particular, the electrically conductive wires are heated and placed or cut into the foam or placed on a supporting structure and enveloped in foam to form the measurement system 100. The geometric design corresponds to the example of FIG. 4, in particular with regard to the meandering conductor 2, 2' passing through the measuring zones.

Figure 7:
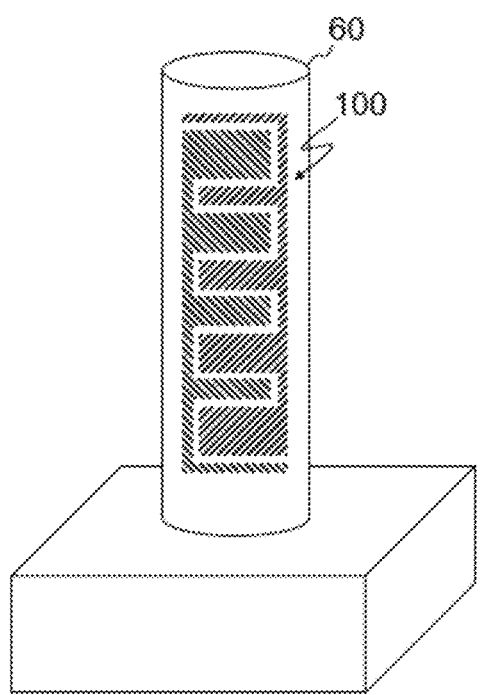
FIG. 7: shows a schematic representation of a steering device according to the invention with two steering device sensors according to the invention in a further embodiment.

Finally, FIG. 7 shows a steering device in the form of a joystick 60, in which a measurement system 100 according to the embodiment according to FIG. 2 is integrated into the control rod enclosing the joystick.

With the measurement systems 100 according to FIGS. 2, 3, 4, 6 and 7, an unspecified operating system for a steering device can be realized using the information obtained from the measurement about where a contact with the measurement system has taken place. For this purpose, the location of the contact over time is determined by evaluation electronics from the measured signals of the steering device sensor, in particular the difference signal of the steering device sensors 1, 3, and is evaluated with regard to predetermined, known contact location profiles. In the evaluation electronics of the operator control system, sensor signal profiles, preferably with tolerance ranges, for different control gestures which can also be combined, such as swiping in one or the other direction along the measurement system 100, tapping on a predetermined region or circular swiping, are stored and are compared with measured contact location profiles.

Figure 8:
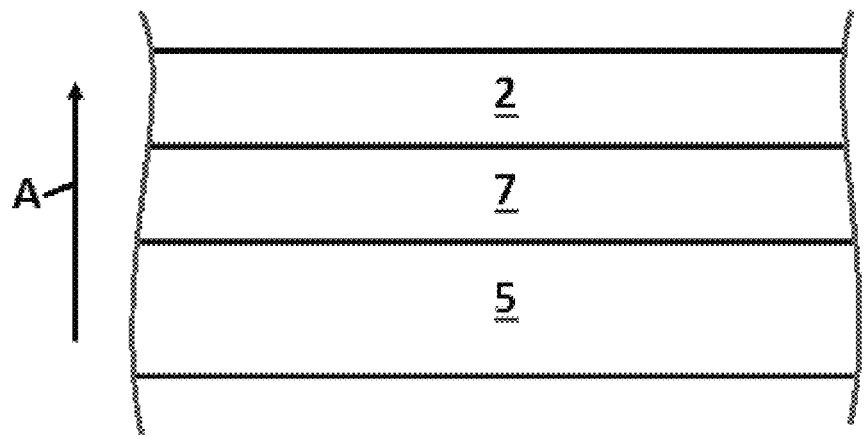
FIG. 8: shows a schematic representation of a steering device sensor according to the invention in a further embodiment.
Figure 9:
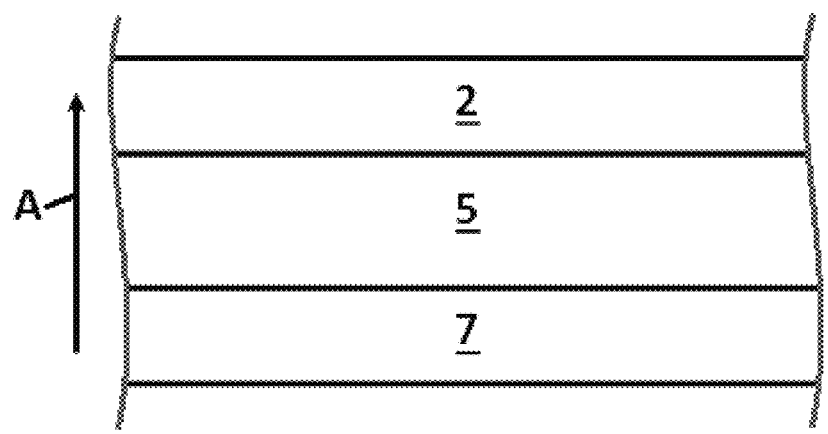
FIG. 9: shows a schematic representation of a steering device sensor according to the invention in a further embodiment.

As shown in FIGS. 8-9, the steering device sensor 1 can include an electrical auxiliary function conductor 7 arranged below the electrical conductor 2 relative to an upward-pointing direction (indicated at arrow A) from the support 5 to the electrical conductor 2. In other words, the electrical conductor 2 is above the support 5 and the electrical auxiliary function conductor 7 is either below the support 5 (FIG. 9) or between the electrical conductor 2 and the support 5 (FIG. 8), wherein the electrical auxiliary function conductor 7 is electrically insulated from the electrical conductor 2. The electrical auxiliary function conductor 7 may also comprise a semiconductor or consist of a semiconductor. The electrical auxiliary function conductor 7 may be used as a shield. In its structural design, the auxiliary function conductor 7 may resemble the electrical conductor 2. In particular, the auxiliary function conductor 7 as a shield may be connected or controlled as shielding at ground potential, as active shielding or as dynamic shielding. As a shield, the electrical auxiliary function conductor 7 has the effect of improving the quality of a measurement signal from the electrical conductor 2 and suppressing interference such as interference fields.

The auxiliary function conductor 7 may be connected in such a way that it temporarily works as a sensor like the electrical conductor 2. In this embodiment, an electric field can be formed between the auxiliary function conductor 7 working as a sensor and the electrical conductor 2, the preferably capacitive influence of which can be measured by capacitive coupling.

REFERENCE CHARACTERS 1, 3 steering device sensor
2, 2' electrical conductor
5 support
10, 12, 14, 16, 18 measuring zones
20 base
30, 32, 34, 36, 38 measuring zones
50 steering wheel
60 joystick

The invention claimed is:

1. A steering device sensor (1, 3) comprising an electrically insulating support (5) which can be integrated into a steering device for a vehicle and an electrical conductor (2, 2') connected to the electrically insulating support (5), the electrical conductor on the electrically insulating support (5) forming multiple measuring zones (10, 12, 14, 16, 18; 30, 32, 34, 36, 38) of different measuring sensitivity, a distance being formed between each two of the multiple measuring zones (10, 12, 14, 16, 18, 30, 32, 34, 36, 38), the distance between the multiple measuring zones (10, 12, 14, 16, 18, 30, 32, 34, 36, 38) decreasing strictly monotonically in a main direction of the extent of the steering device sensor (1, 3).

2. The steering device sensor (1, 3) as claimed in claim 1, wherein the different measuring sensitivity of the multiple measuring zones (10, 12, 14, 16, 18; 30, 32, 34, 36, 38) increase strictly monotonically in the main direction of the extent of the steering device sensor (1, 3).

3. The steering device sensor (1, 3) as claimed in claim 1, wherein different measuring sensitivity of the multiple measuring zones (10, 12, 14, 16, 18; 30, 32, 34, 36, 38) increase linearly in the main direction of the extent of the steering device sensor (1, 3), or that the different measuring sensitivity of the multiple measuring zones (10, 12, 14, 16, 18; 30, 32, 34, 36, 38) increase exponentially in the main direction of the extent of the steering device sensor (1, 3).

4. The steering device sensor (1, 3) as claimed in claim 1, wherein the electrical conductor comprises a base extending along the main direction of the extent of the steering device sensor (1, 3), wherein the multiple measuring zones (10, 12, 14, 16, 1; 30, 32, 34, 36, 38) extend from the base transversely to the main direction.

5. The steering device sensor (1, 3) as claimed in claim 1, wherein the electrical conductor forms a base which connects the multiple measuring zones (10, 12, 14, 16, 18; 30, 32, 34, 36, 38) electrically conductively to each other, wherein the base has a lower measuring sensitivity than a measuring zone of lowest measuring sensitivity of the multiple measuring zones (10, 12, 14, 16, 18, 30, 32, 34, 36, 38).

6. The steering device sensor (1, 3) as claimed in claim 1, wherein the electrically insulating support (5) comprises a film and the electrical conductor comprises an electrically conductive material printed on the film, or that the electrically insulating support (5) comprises woven goods, knitted fabric and/or knitted goods and the electrical conductor comprises an electrically conductive thread.

7. The steering device sensor (1, 3) as claimed in claim 1, wherein the electrically insulating support (5) comprises a thermoplastically deformable plastic, wherein the electrical conductor is at least partially enclosed by the thermoplastically deformable plastic in the circumferential direction of the electrical conductor.

8. The steering device sensor (1, 3) as claimed in claim 1, wherein the multiple measuring zones (10, 12, 14, 16, 18, 30, 32, 34, 36, 38) are each formed by a surface electrode covered by one of the electrical conductors (2, 2'), or that the steering device sensor (1, 3) comprises the multiple measuring zones (10, 12, 14, 16, 18, 30, 32, 34, 36, 38), each traversed by the electrical conductor (2, 2').

9. A steering device for a motor vehicle comprising the at least one steering device sensor (1, 3) as claimed in claim 1, for detecting a contact with the steering device for the motor vehicle, wherein the steering device sensor (1, 3) has the multiple measuring zones (10, 12, 14, 16, 18, 30, 32, 34, 36, 38) of different measuring sensitivity.

10. A steering device sensor (1, 3), comprising:
an electrically insulating support (5) which can be integrated into a steering device for a vehicle;
an electrical conductor (2, 2') connected to the electrically insulating support (5), the electrical conductor (2, 2') on the electrically insulating support (5) forming multiple measuring zones (10, 12, 14, 16, 18; 30, 32, 34, 36, 38) of different measuring sensitivity; and
an electrical auxiliary function conductor (7), which is arranged below the electrical conductor (2, 2') with respect to an upward-pointing direction from the electrically insulating support (5) to the electrical conductor (2, 2').

11. The steering device sensor (1, 3) as claimed in claim 10, wherein the electrical conductor forms a base which connects the multiple measuring zones (10, 12, 14, 16, 18; 30, 32, 34, 36, 38) electrically conductively to each other, wherein the base has a lower measuring sensitivity than a measuring zone of lowest measuring sensitivity of the multiple measuring zones (10, 12, 14, 16, 18, 30, 32, 34, 36, 38).

12. The steering device sensor (1, 3) as claimed in claim 10, wherein the multiple measuring zones (10, 12, 14, 16, 18, 30, 32, 34, 36, 38) are each formed by a surface electrode covered by the electrical conductor (2, 2'), respectively or that the steering device sensor (1, 3) comprises the multiple measuring zones (10, 12, 14, 16, 18, 30, 32, 34, 36, 38), each traversed by the electrical conductor (2, 2').

13. The steering device sensor (1, 3) as claimed in claim 10,
wherein the distinct combination of measuring sensitivities of the multiple measuring zones (10, 12, 14, 16, 18; 30, 32, 34, 36, 38) increase strictly monotonically in a main direction of the extent of the steering device sensor (1, 3).

14. The steering device sensor (1, 3) as claimed in claim 10, wherein a distance is formed between each two of the multiple measuring zones (10, 12, 14, 16, 18, 30, 32, 34, 36, 38), wherein the distances between the multiple measuring zones (10, 12, 14, 16, 18, 30, 32, 34, 36, 38) decrease strictly monotonically in a main direction of the extent of the steering device sensor (1, 3).

15. A steering device for a motor vehicle comprising the steering device sensor as claimed in claim 10 for detecting a contact with the steering device for the motor vehicle.

16. A measurement system for a steering device, comprising:
two steering device sensors (1, 3), each steering device sensor from the two steering devices sensors (1, 3) including
an electrically insulating support (5) which can be integrated into the steering device for a vehicle, and
an electrical conductor (2, 2') connected to the electrically insulating support (5), the conductor on the electrically insulating support (5) forming multiple measuring zones (10, 12, 14, 16, 18; 30, 32, 34,36, 38) of different measuring sensitivity,
wherein the multiple measuring zones (10, 12, 14, 16, 18, 30, 32, 34, 36, 38) of the two steering device sensors (1, 3) are arranged in such a way that, in pairs, a measuring zone of one steering device sensors (1, 3) with a respective neighboring measuring zone of the other steering device sensor from the steering device sensors (1, 3) have a distinct combination of measuring sensitivities.

17. The measurement system as claimed in claim 16, wherein the two steering device sensors (1, 3) are each of a comb-like design and interlocked with each other, and/or that the measurement system is set up and intended to determine a difference signal of the two steering device sensors (1, 3).

18. The measurement system as claimed in claim 4, wherein the two steering device sensors (1, 3) each comprise the electrical conductor (2, 2') respectively connected to a common support (5).

19. An operator control system for the steering device comprising the measurement system designed according to claim 16 for detecting a contact with the steering device, wherein the measurement system has the multiple measuring zones (10, 12, 14, 16, 18, 30, 32, 34, 36, 38) as pairs with a distinct combination of measuring sensitivities, and an evaluation device, wherein the evaluation device is set up and determined to receive a difference signal profile concerning the multiple measuring zones (10, 12, 14, 16, 18, 30, 32, 34, 36, 38) as pairs of different combination of measuring sensitivities and to determine the multiples measuring zones (10, 12, 14, 16, 18, 30, 32, 34, 36, 38) as pairs which was touched from the difference signal profile.

20. A steering device for a motor vehicle comprising the measurement system as claimed in claim 16 for detecting a contact with the steering device for the motor vehicle.

* * * * *